United States Patent
Erickson et al.

(10) Patent No.: US 6,363,019 B1
(45) Date of Patent: Mar. 26, 2002

(54) METHOD AND CIRCUIT FOR VERIFYING CONFIGURATION OF PROGRAMMABLE LOGIC DEVICE

(75) Inventors: Brian D. Erickson, Soquel; Barry Wong, Los Gatos; Patrick T. Bever, Santa Clara, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/706,242

(22) Filed: Nov. 3, 2000

(51) Int. Cl.$^7$ .................................................. G11C 7/00
(52) U.S. Cl. ............................. 365/189.07; 365/189.01; 365/230.08
(58) Field of Search ....................... 365/189.01, 189.05, 365/189.07, 230.06, 198, 104, 230.08

(56) References Cited

U.S. PATENT DOCUMENTS 5,880,988 A * 3/1999 Bertin et al. ................... 365/63

\* cited by examiner

*Primary Examiner*—David Nelms
*Assistant Examiner*—Thong Le

(74) *Attorney, Agent, or Firm*—Bever Hoffman & Harms LLP

(57) ABSTRACT

A programmable logic device (PLD) including a non-volatile memory array for persistently storing configuration data, and a volatile memory array for temporarily storing the configuration data and controlling the various logic resources of the PLD to perform a user's logic operation. When the PLD is reset, an addressing circuit causes a column of non-volatile memory cells to transmit configuration data values to a corresponding column of volatile memory cells on a series of write lines. To verify that a configuration data value is successfully written from each non-volatile memory cell to a corresponding volatile memory cell, the data value transmitted on each write line is compared with the stored data value transmitted from each volatile memory cell on a corresponding read line. A control signal is generated when all of the data values transmitted on the write lines are equal to stored data values transmitted on corresponding read lines, thereby indicating that the configuration data values are successfully transferred to the column of volatile memory cells. The control signal is used to increment the address circuit, thereby addressing a next sequential column of non-volatile memory cells and associated volatile memory cells. Normal PLD operation is initiated when all configuration data is transferred.

20 Claims, 3 Drawing Sheets

US 6,363,019 B1

METHOD AND CIRCUIT FOR VERIFYING CONFIGURATION OF PROGRAMMABLE LOGIC DEVICE

FIELD OF THE INVENTION

This invention relates to the field of integrated circuits, and more specifically to programmable logic devices.

BACKGROUND OF THE INVENTION

Programmable logic devices (PLDs) are a class of integrated circuits (ICs) that can be programmed by a user to emulate various logic functions. Logic designers typically use PLDs to implement control logic in electronic systems because they are relatively easy to program, and often can be reprogrammed to update the emulated logic function. This often makes the use of PLDs less costly in comparison to custom hardwired or "application specific" integrated circuits (ASICs).

PLDs include configurable (programmable) logic resources that are controlled by configuration data stored in configuration memory cells on the PLD. PLD configuration memory is typically classified as either non-volatile (e.g., EPROM, EEPROM, or flash and/or fuse/antifuse), or volatile (e.g., SRAM). The benefit of non-volatile memory is that configuration data is retained (persistent) even if power is discontinued. However, non-volatile memory typically requires special programming and erasing voltages, and typically requires relatively long program/erase times. In contrast, volatile memory (e.g., SRAM memory) is readily configured using normal system voltages, but requires a configuration operation (i.e., writing configuration data into the volatile memory array) each time power to the PLD is terminated.

Configuration operations typically involve transmitting configuration data values from a non-volatile memory device (e.g., an EPROM) to the volatile configuration memory of a PLD. However, some recently developed PLDs include both a non-volatile memory array and volatile memory array on the same chip. At power-up, the configuration data is written from the non-volatile memory array to the volatile memory array, which then controls programmable logic of the PLD during normal operation.

A potential problem with PLDs utilizing volatile configuration memory is the potential storage of erroneous configuration data in the volatile memory array. These storage errors occur, for example, at power-up because configuration data is written to the volatile memory array before system voltages have stabilized, thereby causing one or more volatile memory cells to store erroneous data values. Accordingly, when normal operations are initiated, the PLD can implement an unintended logic operation.

What is needed is a circuit and method for verifying that a PLD is properly configured before initiating a user's logic function.

SUMMARY OF THE INVENTION

The present invention is directed to a circuit and a method for verifying that configuration data is successfully transferred to a volatile memory array in a PLD.

According to the present invention, configuration data is verified during each stage of a configuration operation by comparing a set of configuration data values transmitted on a series of write lines to stored data values read from a column of volatile configuration memory cells of the PLD. The configuration operation is controlled such that sequential groups of configuration data values are transmitted onto the write lines when a preceding group of configuration data values are successfully stored in an addressed group of volatile memory cells. Specifically, when a group of configuration data values are transmitted on the write lines, each volatile memory cell is addressed (a) to latch a configuration data value transmitted on a corresponding write line, and (b) to transfer the currently stored data value onto a corresponding read line. When the configuration data value transmitted on each write line is equal to the stored data value transmitted on each corresponding read line, the comparator generates a control signal verifying that the configuration data values are successfully stored in the volatile memory cells. The control signal is then used to control the transmission of a new set of configuration data values and to address a new set of volatile memory cells.

In accordance with the present invention, a PLD includes an addressing circuit and a comparator circuit to control the transfer of configuration data from a non-volatile memory array to a volatile memory array. The addressing circuit generates an address signal that is applied to a selected column of non-volatile memory cells, causing the column of non-volatile memory cells to transmit configuration data values onto a series of write lines. The address signal is also applied to first select transistors of a corresponding column of volatile memory cells, thereby selectively coupling each volatile memory cell to a corresponding write line. In addition, the address signal is applied to second select transistors of the corresponding column of volatile memory cells, thereby causing each volatile memory cell to transmit its stored data value onto a corresponding read line. The comparator circuit compares the configuration data value on each write line with the stored data value transmitted from the associated volatile memory cell on the corresponding read line, and generates a control signal only when all of the configuration data values match the stored data values. This control signal is used to increment the addressing circuit, thereby causing a second column of non-volatile memory cells to write configuration data values on the write lines to a corresponding second column of volatile memory cells, whose stored data values are then compared in the manner described above. This process is repeated until all configuration data values are written to the volatile memory array. After the configuration operation is completed, the programmable logic resources are controlled by the volatile memory array to perform a user's logic operation that is defined by the configuration data.

The present invention prevents incrementing the addressing circuit until the data values stored in all of the volatile memory cells are equal to the configuration data values transmitted to the volatile memory cells. Accordingly, the present invention avoids erroneous configuration of the volatile memory cells due, for example, to a fluctuating voltage supply at power-up, by delaying the configuration operation until the voltage supply is sufficiently stabilized to successfully transfer all configuration data values to the volatile memory array.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to methods and circuits for verifying the transfer of configuration data to volatile memory cells in a programmable logic device (PLD). While the present invention is described below with particular reference to SRAM-based Complex PLDs (CPLDs), the present invention may also be beneficially utilized in other integrated circuits (ICs) and/or other types of PLDs. Further, while the present invention is described below with particular reference to CPLDs including both non-volatile (e.g., flash) and volatile (e.g., SRAM) memory arrays, the present invention may also be beneficially utilized in PLDs including only a volatile configuration memory array (e.g., SRAM PLDs that are configured using an external flash memory device at power-up).

Figure 1:
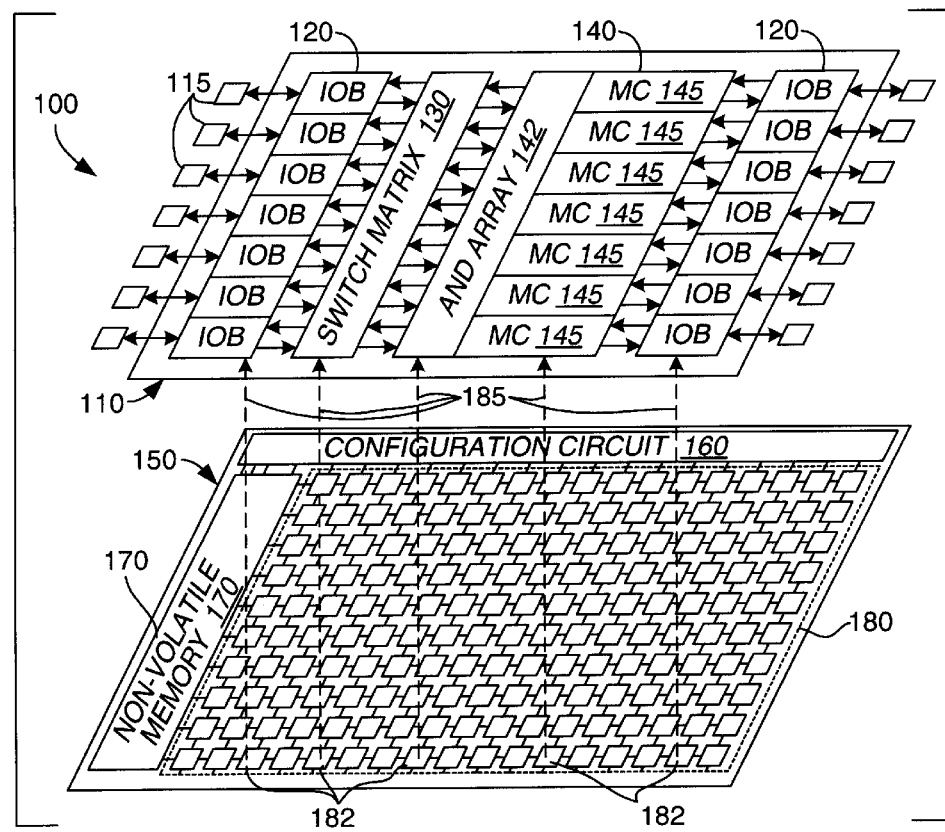
FIG. 1 is a split-level perspective view depicting simplified logic and configuration planes of a PLD in accordance with an embodiment of the present invention.

FIG. 1 is a split-level perspective diagram of a CPLD 100 in accordance with one embodiment of the present invention. To simplify the following description, CPLD 100 is functionally separated into a logic plane 110, which includes programmable circuitry used to implement selected logic operations, and a configuration plane 150 that includes memory circuits for storing configuration data utilized to control the programmable circuitry of logic plane 110. Other simplifications and functional representations are utilized to facilitate the following description.

Referring to the upper portion of FIG. 1, the programmable circuitry of PLD 100 is included logic plane 110. For explanatory purposes, logic plane 110 of CPLD 100 includes features common to XC9500-XL an XC9500-XV CPLDs that are produced by Xilinx, Inc. of San Jose, Calif. In particular, CPLD 100 includes input/output (I/O) terminals 115, I/O blocks (IOBs) 120, an interconnect switch matrix 130, and several function blocks 140 (one shown). IOBs 120 provide buffering for device input and output signals that are applied to I/O pins 115. Input signals are passed through IOBs 120 to switch matrix 130, and selected output signals from FB 140 are fed back into switch matrix 130. Each FB 140 includes an AND array 142 that logically ANDs input signals received from switch matrix 130 to form product term (P-term) signals that are applied to any of several macrocells 145. Each macrocell 145 is programmable to generate a sum-of-products term using selected P-term signals. These sum-of-products terms are output from macrocells 145 to IOB 120 (along with optional corresponding output enable signals). Those of ordinary skill in the art generally understand these and other circuits and operations of the programmable circuitry of logic plane 110 (described above).

Referring to the lower portion of FIG. 1, configuration plane 150 generally includes a configuration circuit 160, an optional non-volatile memory array 170, and a volatile memory array 180.

Configuration circuit 160 performs several functions associated with configuration plane 150, including configuration operations (discussed below) during which configuration data is transferred from non-volatile memory array 170 to volatile memory array 180. Other functions performed by configuration circuit 160 that are not discussed herein include controlling the transfer of configuration data into non-volatile memory 170. Circuitry associated with these additional functions is omitted from the following discussion for clarity.

Non-volatile memory array 170 is provided to persistently store configuration data (i.e., when CPLD 100 is powered down). Non-volatile memory array 170 comprises, for example, EPROM, EEPROM, or flash memory cells arranged in rows and columns. Note that the configuration data written into volatile memory array 180 is used to directly control most of logic plane 110, although some configuration data stored in non-volatile memory array 170 may also be used to directly control some of logic plane 110.

Volatile memory array 180 includes volatile (e.g., SRAM) configuration memory cells 182 arranged in rows and columns that temporarily store configuration data (e.g., until power to CPLD 100 is removed). During configuration operation, configuration circuit 160 routes configuration data from non-volatile memory array 170 to corresponding configuration memory cells 182 of volatile memory array 180. During subsequent "normal" operation of CPLD 100, the configuration data stored in volatile memory array 180 is used to control associated logic resources of logic plane 110 via connections 185 (indicated by dashed arrows) in a manner understood by those of ordinary skill in the art, thereby causing CPLD 100 to implement the logic operation defined by the configuration data.

Figure 2:
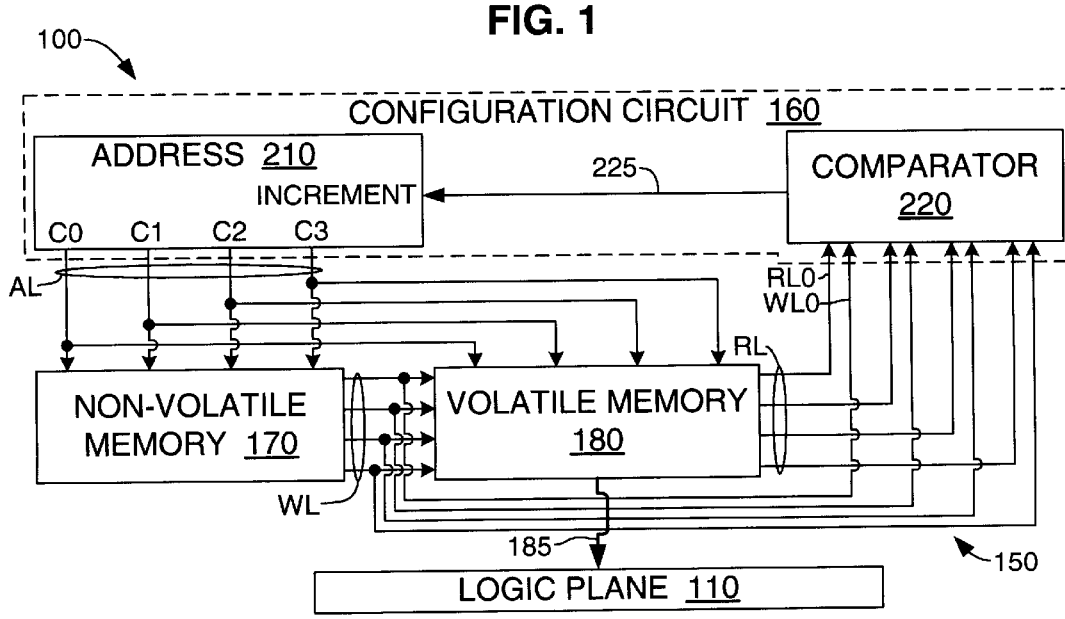
FIG. 2 is a block diagram showing the PLD shown in FIG. 1.

FIG. 2 is a simplified block diagram showing configuration plane 150 of CPLD 100 in additional detail. As mentioned above, configuration plane 150 includes configuration circuit 160, non-volatile memory array 170, and volatile memory array 180.

As indicated in the central portion of FIG. 2, non-volatile memory array 170 receives address signals from configuration circuit 160 on address lines AL. Each address line accesses one column of non-volatile memory cells, which are arranged in rows and columns, thereby causing the addressed column of memory cells to transmit configuration data values onto a series of write lines WL.

The configuration data values transmitted on write lines WL are passed to volatile memory array 180, which also receives the address signals transmitted from configuration circuit 160 on address lines AL. The volatile memory cells of volatile memory array 180 are also arranged in rows and columns, each column of volatile memory cells being associated with a corresponding column of non-volatile memory cells in non-volatile memory array 170. When a particular column of non-volatile memory cells is addressed during a configuration operation, the address signal also accesses the column of volatile memory cells that corresponds to the addressed column of non-volatile memory cells. As described in additional detail below, the configuration data values transmitted from the addressed column of non-volatile memory cells on write lines WL are latched into the corresponding addressed column of volatile memory cells. In addition, in response to the address signal, the addressed column of volatile memory cells transmits stored data values onto a plurality of read lines RL.

As indicated in the upper portion of FIG. 2, configuration circuit 160 includes an address circuit 210 and a comparator 220. Address circuit 210 generates an address signal onto a selected address line AL via output terminals C0 through C3 in response to internal logic. Comparator 220 has a first set of input terminals for receiving configuration data values transmitted on write lines WL, and a second set of input terminals for receiving stored data values transmitted on read lines RL. An output signal generated by comparator 220 is transmitted from output terminal 225 to an increment control terminal of counter 210.

In accordance with the present invention, during a configuration operation, comparator 220 generates the control signal on output terminal 225 only when a set of configuration data values transmitted on write lines WL are equal to the corresponding stored data values transmitted on read lines RL.

The set of configuration data values are transmitted from a column of non-volatile memory cells in response to an address signal. Similarly, the corresponding stored data values are transmitted from a column of volatile memory cells also accessed in response to the address signal. Comparator 220 compares configuration data values and stored data values transmitted on corresponding pairs of write/read lines such that each configuration data value transmitted on a particular write line (e.g., WL0) is compared with a stored data value transmitted on its corresponding read line (e.g., RL0). Note that, because the configuration data value is written from a non-volatile memory cell to its corresponding volatile memory cell, the stored data value transmitted on a read line (e.g., RL0) is equal to the configuration data value transmitted on a corresponding write line (e.g., WL0) when the configuration data value is successfully stored in the corresponding volatile memory cell. When the configuration data values and the stored data values transmitted on each corresponding pair of write/read lines are equal, thereby indicating that the configuration data values are successfully stored in the addressed column of volatile memory cells, comparator 220 generates the increment control signal. This increment control signal is utilized to cause address circuit 210 to incrementally generate address signals on each address line AL, thereby sequentially addressing each column of non-volatile memory cells such that configuration data values are written into corresponding columns of volatile memory cells. After all configuration data values are successfully transferred, the configuration data values stored in volatile memory array 180 are applied via connections 185 to control associated logic resources of logic plane 110 (see FIG. 1). Control circuitry initiating this logic operation phase is omitted for brevity.

Figure 3:
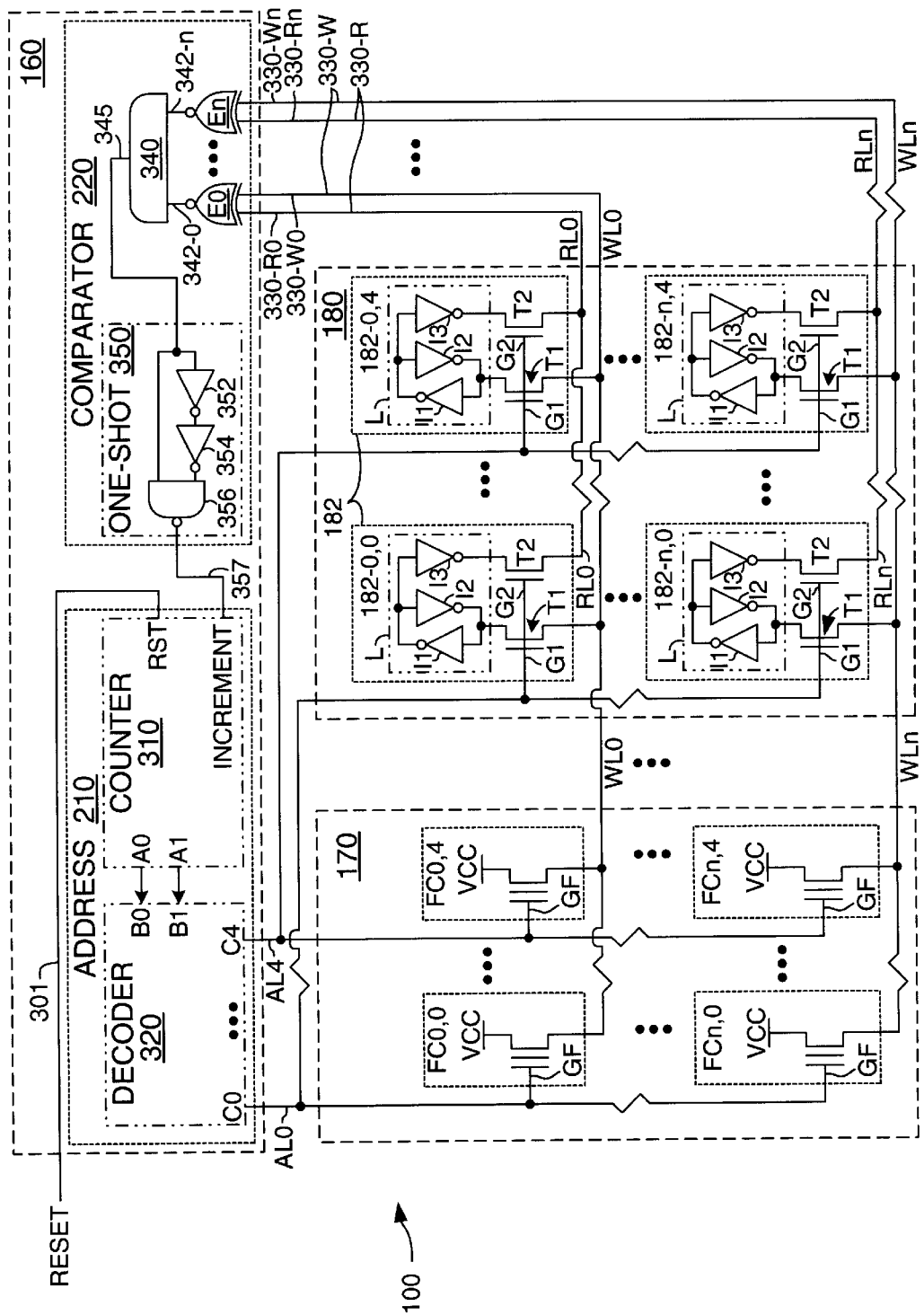
FIG. 3 is a simplified schematic diagram showing the configuration plane of the PLD shown in FIG. 2.

FIG. 3 is a simplified schematic diagram showing CPLD 100 in additional detail.

Referring to configuration circuit 160 (upper portion of FIG. 3), address circuit 210 includes a counter 310 and a decoder 320. Counter 310 generates binary count values (e.g., "00", "01", "10", and "11") using known techniques that are transmitted via output terminals A0 and A1 to decoder 320. Counter 310 includes a reset (RST) terminal for receiving a reset command that is used to initialize the count value (e.g., to "00"), and an increment terminal for receiving command signals from comparator 220 that are used to change (increment) the count value (e.g., from "00" to "01"). Decoder 320 decodes the count value generated by counter 310, and generates an address signal on an associated address line in response to the decoded count value. Decoder 320 has input terminals B0 and B1 for receiving the count value from counter 310, and output terminals C0 through C4 through which an address signal (e.g., logic "1" or VCC) are transmitted onto a selected one of the address lines AL0 through AL4 in response to the decoded count value. For example, when the count value received from counter 310 is "00", decoder 320 generates an address signal on address line AL0, and when the count value is "11", decoder 320 generates an address signal on address line AL4.

Volatile memory array 170 includes flash (non-volatile) memory cells FC0, 0 through FCn, 4 arranged in rows and columns. Each flash memory cell includes a floating gate structure for storing a configuration data value, a select terminal GF connected to a corresponding address line, a first terminal connected to system voltage source VCC, and a second terminal connected to a corresponding write line. Flash memory cells in each column are connected to the same address line. For example, select terminals GF of flash memory cells FC0, 0 and FCn, 0 are connected to address line AL0. Similarly, each row of flash memory cells is connected to the same write line. For example, the second (lower) terminals of flash memory cells FC0, 0 and FC0, 4 are connected to write line WL0. Accordingly, each address signal generated by address circuit 210 causes one column of flash memory cells to transmit a set of configuration data values onto write lines WL0 through WLn. For example, in response to a first address signal transmitted on address line AL0, flash memory cells FC0, 0 and FCn, 0 (along with any intervening flash memory cells in the column including these cells) apply their respective configuration data values onto write lines WL0 and WLn, respectively. Alternatively, in response to a second address signal transmitted on address line AL4, flash memory cells FC0, 4 and FCn, 4 apply their respective configuration data values onto write lines WL0 and WLn, respectively.

Volatile memory array 180 includes SRAM (volatile) memory cells 182 (identified as 182-0, 0 through 182-n, 4) that are arranged in rows and columns. Each SRAM memory cell 182 includes a latch L for temporarily storing a data value, a first transistor T1 connected between the latch and an associated write line, and a second transistor T2 connected between the latch and an associated read line. For example, latch L of SRAM memory cell 182-0, 0 includes a first inverter I1 and a second inverter I2 connected in a loop, and a third inverter I3 having an input terminal connected to the output terminal of inverter I1. First transistor T1 has a first terminal connected to the input terminal of first inverter I1, and a second terminal connected to write line WL0. Second transistor T2 has a first terminal connected to the output terminal of third inverter I3, and a second terminal connected to read line RL0.

Similar to flash memory array 170, each column of SRAM memory cells of non-volatile memory array 180 is connected to the same address line, and each row of SRAM memory cells is connected to the same write line and read line. Specifically, in each column of SRAM memory cells, gate terminals G1 of first transistors T1 and gate terminals G2 of second transistors T2 are connected to the same address line (which is also connected to gate terminals GF of a corresponding column of flash memory cells). For example, gate terminals G1 and G2 of memory cells 182-0, 0 and 182-n, 0 (along with any intervening SRAM memory cells in the column including these cells) are connected to address line AL0, which, as described above, is connected to gate terminals GF of flash memory cells FC0, 0 and FCn, 0 (along with any intervening flash memory cells in the column including these cells). Accordingly, when a first address signal is applied to address line AL0 by address circuit 210, first transistor T1 is turned on to pass the configuration data value transmitted from flash memory cell FC0, 0 on write line WL0 into latch L, and second transistor T2 is turned on to pass the stored data value from latch L onto read line RL0. Subsequently, when an address signal is transmitted on address line AL4, first transistor T1 of SRAM memory cell 182-0, 4 is turned on to pass the configuration data value transmitted from flash memory cell FC0, 4 on write line WL0, and second transistor T2 of SRAM memory cell 182-0, 4 is turned on to transmit the stored data value from its latch L onto read line RL0.

Comparator 220 verifies that configuration data is successfully written from non-volatile memory array 170 to volatile memory array 180 by comparing the configuration data values transmitted on write lines WL0 through WL4 with corresponding stored data values transmitted on read lines RL0 through RL4. Comparator 220 includes a set of first input terminals 330-W, each connected to a corresponding write line WL0 through WLn, and a set of second input terminals 330-R, each connected to a corresponding read line RL0 through RLn. The logic performed by comparator 220 is depicted in FIG. 3 as including a series of two-input (first) exclusive-NOR logic gates E0 through En that receive signals from first input terminals 330-W and second input terminals 330-R, and a multi-input (second) logic AND gate 340 that receives output signals from two-input exclusive-NOR gates E0 through En. Each two-input exclusive-NOR gate (e.g., E0) has a first input terminal (e.g., 330-W0) connected to receive a configuration data value transmitted on a corresponding write line (e.g., WL0), and a second input terminal (e.g., 330-R0) connected to receive a stored data value transmitted on a corresponding read line (e.g., RL0). Each two-input exclusive-NOR gate generates a high output signal when the received configuration data value is equal to the corresponding stored data value (i.e., either both logic "0", or both logic "1"). Multi-input logic AND gate 340 generates a high output signal on an output terminal 345 when high signals are received from all two-input exclusive-NOR gates E0 through En.

Comparator 220 also includes an optional one-shot circuit 350 for generating a pulse output signal in response to the high output signal generated by multi-input logic AND gate 340. In the disclosed embodiment, one-shot circuit 350 includes a first inverter 352 connected in series with a second inverter 354 between terminal 345 and a first input terminal of a logic NAND gate 356. A second terminal of logic NAND gate 356 is connected directly to terminal 345. Accordingly, when a high output signal is generated by multi-input logic AND gate 345, logic NAND gate 356 generates a high output signal until the high output signal propagates through the delay line formed by inverters 352 and 354. Note that an additional control line (not shown) may be required to prevent one-shot circuit 350 from generating a pulse signal when multi-input logic AND gate 340 generates a low output signal when a new address signal is transmitted to non-volatile memory array 170 and volatile memory array 180. Alternatively, the additional pulse control signal may be accounted for in the specific circuitry making up counter 310 using known methods.

Operation of CPLD 100 is described below with reference to FIGS. 3 and 4.

Figure 4:
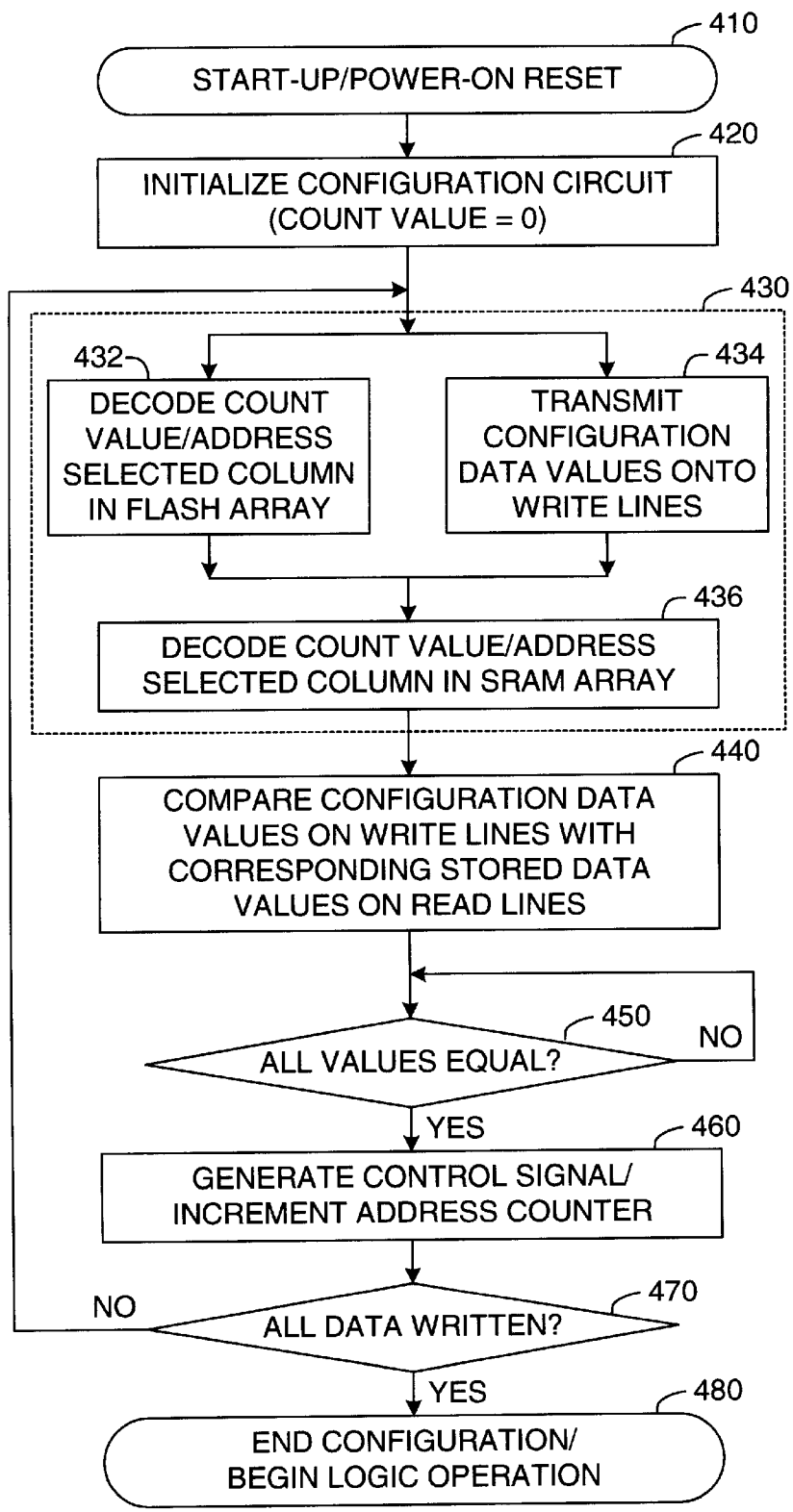
FIG. 4 is a flow diagram showing steps for verifying configuration data according to an embodiment of the present invention.

Referring to FIG. 4, when power is initially applied to CPLD 100, or when a reset operation is performed (Step 310), a reset control signal is transmitted to the configuration circuit that switches address circuit to 210 an initial state (420). For example, referring to FIG. 3, a reset control signal transmitted on reset line 301 is received at the RST terminal of counter 310. In response to this reset control signal, counter 310 generates a pre-defined initial count value (e.g., "00") that is applied to decoder 320.

Referring again to FIG. 4, a first set of configuration data values are then transmitted onto the write lines (Step 430). The initial count value is then decoded, and an initial address signal is generated that accesses a column of non-volatile memory cells, thereby causing the addressed column of non-volatile memory cells to transmit configuration data values onto the write lines. For example, referring to FIG. 3, an address signal transmitted on address line AL0 causes flash memory cells FC0, 0 through FCn, 0 to transmit configuration data values onto write lines WL0 through WLn, respectively. Alternatively, the configuration data values may be supplied from an off-chip source onto the write lines (i.e., in PLDs that do not include both a non-volatile memory array and a volatile memory array) (Step 434).

The address signal also accesses a corresponding column of volatile memory cells in volatile memory array 180 (Step 436). For example, referring to FIG. 3, the address signal on address line AL0 accesses the column including SRAM memory cells 182-0, 0 through 182-n, 0. As described above, the address signal turns on first transistor T1 and second transistor T2 such that the configuration data values transmitted on write lines WL0 through WLn are passed to the latches L of these SRAM memory cells. At the same time, stored data values are transmitted from the these SRAM memory cells onto read lines RL0 through RLn.

The configuration data values transmitted on the write lines are then compared with the stored data values transmitted on the read lines (Step 440). Referring to FIG. 3, this comparison operation is performed by comparator 220, and requires each pair of configuration data and stored data values to be equal. Accordingly, if a particular configuration data value transmitted to a volatile memory cell happens to be equal to the data value already stored in the volatile memory cell, then the comparison test is satisfied immediately. However, if the configuration data value is different from the data value stored in the target volatile memory cell, then the comparison test is not satisfied until the configuration data value is written into the target volatile memory cell. Therefore, the present invention addresses problems associated with low system voltages (i.e., at start-up before power supplies stabilize) by preventing the configuration operation from proceeding until each column of volatile memory cells is successfully programmed.

Upon detecting that all volatile memory cells of an addressed column are successfully programmed (YES in Step 450; FIG. 4), a control signal is then generated that is used to increment the address counter (Step 440), and Steps 430 through 460 are repeated until all configuration data is successfully written into the volatile memory array (470), at which time the configuration circuit initiates normal PLD operations (Step 480).

Although the present invention has been described with respect to certain specific embodiments, it will be clear to those skilled in the art that the inventive features of the present invention are applicable to other embodiments as well, all of which are intended to fall within the scope of the present invention.

We claim:

1. An integrated circuit (IC) device comprising:
    a plurality of write lines for transmitting configuration data values;
    a plurality of read lines;
    a plurality of first volatile memory cells, each first volatile memory cell including a first terminal, a second terminal, and a latch selectively connected to an associated write line of the plurality of write lines through the first terminal, and to an associated read line of the plurality of read lines through the second terminal;
    a comparator having a plurality of first input terminals connected to the plurality of write lines, a plurality of second input terminals connected to the plurality of read lines, wherein, when first configuration signals are transmitted on the plurality of write lines, in response to a first address signal, each first volatile memory cell passes a first configuration data value from its associated write line to its latch through its first terminal, and transmits a first stored data value from its latch to its associated read line through its second terminal, and wherein the comparator generates a control signal only when the first configuration data values transmitted on the plurality of write lines are equal to the first stored data values transmitted on the plurality of read lines.

2. The IC device according to claim 1, further comprising:

a plurality of second volatile memory cells, each second volatile memory cell including a latch selectively connected between an associated write line of the plurality of write lines and an associated read line of the plurality of read lines;

an address circuit for generating said first address signal on a first address line, for receiving the control signal generated by the comparator, and for generating a second address signal on a second address line in response to the control signal, wherein, in response to the second address signal, each second volatile memory cell passes a second configuration data value from its associated write line to its latch, and transmits a second stored data value from its latch to its associated read line.

3. The IC device according to claim 2, further comprising a plurality of non-volatile memory cells including:

a first group of non-volatile memory cells for transmitting the first configuration data values in response to the first address signal; and a second group of non-volatile memory cells for transmitting the second configuration data values in response to the second address signal.

4. The IC device according to claim 2, wherein each first volatile memory cell comprises a first transistor connected between its latch and its associated write line, and a second transistor connected between its latch and its associated read line, and wherein gate terminals of the first and second transistors are connected to the first address line.

5. The IC device according to claim 4, wherein the latch of each of the plurality of first volatile memory cells comprises:

a first inverter having an input terminal connected to the first transistor;

a second inverter having an input terminal connected to an output terminal of the first inverter, and an output terminal connected to the input terminal of the first inverter; and a third inverter having an input terminal connected to the output terminal of the first inverter, and an output terminal connected to the second transistor.

6. The IC device according to claim 1, wherein the comparator comprises:

a plurality of first logic gates, each first logic gate having a first input terminal connected to an associated write line of the plurality of write lines, and a second input terminal connected to an associated read line of the plurality of read lines; and a second logic gate having a plurality of input terminals connected to output terminals of the plurality of first logic gates, wherein each of the plurality of first logic gates generate a first output signal when the first configuration data value transmitted on its associated write line is equal to the first stored data value transmitted on its associated read line, and wherein the second logic gate generates a second output signal when the first output signal is received from all of the plurality of first logic gates.

7. The IC device according to claim 6, wherein the plurality of first logic gates are two-input exclusive-NOR gates, and the second logic gate is a multi-input logic AND gate.

8. The IC device according to claim 6, wherein the comparator further comprises a one-shot circuit connected to an output terminal of the second logic gate and generates the control signal in response to the second output signal.

9. The IC device according to claim 2, wherein the address circuit comprises:

a counter for generating a count value such that the count value is incremented upon receiving the control signal transmitted from the comparator; and a decoder for decoding the count value generated by the counter, and for generating an address signal on an associated address line in response to the decoded count value.

10. The IC device according to claim 1, further comprising a plurality of programmable logic resources for implementing a logic operation in accordance with configuration data stored in the plurality of volatile memory cells.

11. A programmable logic device comprising:

a non-volatile memory cell connected to a write line;

a volatile memory cell including a latch, a first transistor connected between the latch and the write line, and a second transistor connected between the latch and a read line;

a comparator having a first input terminal connected to the write line, a second input terminal connected to the read lines, and an output terminal; and an addressing circuit having a control terminal connected to the output terminal of the comparator, and an output terminal connected to an address line, wherein the address line is connected to gate terminals of the non-volatile memory cell, the first transistor of the volatile memory cell, and the second transistor of the volatile memory cell, wherein the addressing circuit applies an addressing signal onto the address line until a control signal is received at the control terminal, and wherein the comparator generates the control signal when a configuration data value transmitted from the non-volatile memory cell onto the write line is equal to a stored data value transmitted from the latch of the volatile memory cell onto the read line.

12. A method for configuring a programmable logic device including a volatile memory array for temporarily storing configuration data values, a plurality of programmable logic resources controlled by the configuration data values temporarily stored in the volatile memory array, and a configuration circuit for controlling the volatile memory array such that the configuration data is written into the volatile memory array during a configuration operation, the method comprising:

transmitting a plurality of first configuration data values on a plurality of write lines;

addressing a plurality of first volatile memory cells such that the plurality of first configuration data values are passed from the plurality of write lines into the plurality of first volatile memory cells, and first stored data values are transmitted from the plurality of first volatile memory cells onto a plurality of read lines;

comparing the first configuration data values transmitted on a plurality of write lines with corresponding first stored data values transmitted on the plurality of read lines; and generating a control signal when each configuration data value transmitted on a write line of the plurality of write lines is equal to a stored data value transmitted on a corresponding read line of the plurality of read lines.

13. The method according to claim 12, wherein transmitting the plurality of first configuration data values comprises addressing a plurality of non-volatile memory cells, each non-volatile memory cell being connected to an associated write line of the plurality of write lines and storing a first configuration data value.

14. The method according to claim 12, wherein addressing further comprises generating a count value, decoding the count value to select an address line, and transmitting an address signal onto an address line that is connected to the plurality of first volatile memory cells.

15. The method according to claim 14, further comprising initializing the count value in accordance to a power-on reset control signal.

16. The method according to claim 14, wherein addressing further comprises:

selectively connecting the first write line to a latch of a first volatile memory cell by transmitting the address signal to a gate terminal of a first select transistor connected between the first read line and the latch, and selectively connecting the latch to a first read line by transmitting the address signal to a gate terminal of a second select transistor connected between the latch and the first read line.

17. The method according to claim 12, wherein comparing comprises transmitting a first configuration data value and a first stored data value to respective input terminals of a logic gate.

18. The method according to claim 17, further comprising:

transmitting a second configuration data value from a second non-volatile memory cell onto a second write line;

selectively connecting the second write line to a latch of a second non-volatile memory cell;

selectively connecting the latch of the second non-volatile memory cell to a second read line, thereby transmitting a second stored data value from the latch onto the second read line; and determining if the second configuration data value transmitted on the second write line is equal to the second stored data value transmitted on the second read line.

19. The method according to claim 18, wherein generating the control signal comprises determining when the first configuration data value is equal to the first stored data value and the second configuration data value is equal to the second stored data value.

20. The method according to claim 12, wherein generating the control signal comprises producing a pulse signal using a one-shot circuit.

* * * * *